US008775880B2

(12) United States Patent
Singh et al.

(10) Patent No.: US 8,775,880 B2
(45) Date of Patent: Jul. 8, 2014

(54) SHARED FUSE WRAPPER ARCHITECTURE FOR MEMORY REPAIR

(75) Inventors: Viraj Vikram Singh, Allahabad (IN); Ashish Bansal, Noida (IN); Rangarajan Ramanujam, Noida (IN)

(73) Assignee: STMicroelectronics Intenational N.V., Amsterdam (NL)

( * ) Notice: Subject to any disclaimer, the term of this patent is extended or adjusted under 35 U.S.C. 154(b) by 489 days.

(21) Appl. No.: 12/784,424

(22) Filed: May 20, 2010

(65) Prior Publication Data

US 2010/0318843 A1   Dec. 16, 2010

(30) Foreign Application Priority Data

Jun. 11, 2009 (IN) .............................. 1203/DEL/2009

(51) Int. Cl.
*G11C 29/00* (2006.01)
(52) U.S. Cl.
CPC ............ *G11C 29/787* (2013.01); *G11C 29/802* (2013.01)
USPC ........................................................ 714/710

(58) Field of Classification Search
CPC ............................. G11C 29/787; G11C 29/802
USPC ..................................................... 365/200–201
See application file for complete search history.

(56) References Cited

U.S. PATENT DOCUMENTS

| 5,664,089 | A | * | 9/1997 | Byers et al. ..................... 714/14 |
| 5,999,463 | A | * | 12/1999 | Park et al. ..................... 365/200 |
| 6,052,700 | A | * | 4/2000 | Eckard et al. ................. 708/112 |
| 6,804,156 | B2 | * | 10/2004 | Ito ................................. 365/201 |
| 7,313,038 | B2 | * | 12/2007 | Otsuka ......................... 365/201 |
| 7,460,421 | B2 | * | 12/2008 | Kohara ........................ 365/200 |
| 7,477,564 | B2 | * | 1/2009 | Taniguchi et al. ......... 365/225.7 |
| 7,954,023 | B2 | * | 5/2011 | Otsuga et al. ................. 714/726 |
| 2008/0065929 | A1 | | 3/2008 | Nadeau-Dostie et al. |

* cited by examiner

*Primary Examiner* — Steve Nguyen
(74) *Attorney, Agent, or Firm* — Hogan Lovells US LLP (57) ABSTRACT

A memory repair mechanism for the memories clustered across the multiple power domains and can be switched on and off independent of each other, thereby enabling low power operation. Enhancements in the shared Fuse Wrapper Architecture enable sharing of a plurality of parallel links connecting the memory blocks of each power domains to the Shared Fuse Wrapper architecture.

15 Claims, 7 Drawing Sheets

SHARED FUSE WRAPPER ARCHITECTURE FOR MEMORY REPAIR

RELATED APPLICATION

The present application claims priority of India Patent Application No. 1203/Del/2009 filed Jun. 11, 2009, which is incorporated herein in its entirety by this reference.

TECHNICAL FIELD

The present disclosure relates to memory repair and more specifically to a shared fuse wrapper architecture using a single fuse macro cell covering multiple power domains.

BACKGROUND

Advancement in semiconductor technologies allows implementation of multiple memories on a single chip. Due to their high density, memories are prone to faults which reduce the total chip yield. In order to correct such defects memory sub-systems are provided with a repair mechanism that makes use of redundant memory locations.

A memory is periodically tested by an external test hardware or by an on chip dedicated hardware (i.e. memory Built-In-Self-Test (BIST)) in order to identify fault locations. A BIST mechanism uses a built-in algorithm which performs a series of read-write operations to identify one or more defective row or column addresses. The defective row/column is then replaced by a redundant row/column depending upon whether there is a row or column redundancy support. At the end of the test process repair data of the repairable memories is programmed onto the fuse macro cells provided on the chip for all small/medium memories during wafer production. This fused information is further used during chip functional operation as a repair solution.

U.S. Patent Publication No. 2008/0065929A1 entitled "Method and Apparatus for storing and distributing memory repair information" to Nadeau-Dostie, et al. published on Mar. 13, 2008 discloses a system for repairing embedded memories on an integrated circuit. The system comprises an external Built-In Self-repair Register (BISR) associated with every reparable memory on the circuit. Each BISR is configured to accept a serial input from a daisy chain connection and to generate a serial output to a daisy chain connection, so that a plurality of BISRs are connected in a daisy chain with a fuse box controller. The fuse box controller has no information as to the number, configuration or size of the embedded memories, but determines, upon power up, the length of the daisy chain. With this information, the fuse box controller may perform a corresponding number of serial shift operations to move repair data to and from the BISRs and into and out of a fuse box associated with the controller. Memories having a parallel repair interface are supported by a parallel address bus and enable control signal on the BISR, while those having a serial repair interface are supported by a parallel daisy chain path that may be selectively cycled to shift the contents of the BISR to an internal serial register in the memory. Preferably, each of the BISRs has an associated repair analysis facility having a parallel address bus and enable control signal by which fuse data may be dumped in parallel into the BISR and from there, either uploaded to the fuse box through the controller or downloaded into the memory to effect repairs. Advantageously, pre-designed circuit blocks may provide daisy chain inputs and access ports to affect the inventive system there along or to permit the circuit block to be bypassed for testing purposes. While U.S. Patent Publication No. 2008/0065929A1 provides a fuse box module to repair memory structures present in a single power domain, it remains specific to the number, size and configuration of the embedded memory locations and is incapable of supporting memories spanning across plurality of power domains.

SUMMARY

A system of the present invention includes multiple memory blocks spanning a plurality of power domains. The system includes a Shared Fuse Wrapper architecture for storing the repair data of the memory blocks on a centralized fuse macro cell operatively coupled therewith and at least one repair data register for storing memory repair data thereon. Each of the repair data registers is operatively coupled with corresponding memory block and is operative for transmitting the memory repair data thereto to effect repairs of the corresponding memory block. The system includes a plurality of parallel links connecting the memory blocks of each power domains to the Shared Fuse Wrapper architecture.

An embodiment of the present invention includes a multiple memory architecture comprising multiple memory blocks spanning a plurality of power domains. The architecture includes a Shared Fuse Wrapper architecture for storing the repair data of the memory blocks on a centralized fuse macro cell operatively coupled therewith, at least one repair data register for storing memory repair data thereon, each of which is operatively coupled with corresponding memory block and for transmitting the memory repair data thereto to effect repairs thereof, and a plurality of parallel links connecting the memory blocks of each power domains to the Shared Fuse Wrapper architecture.

In another embodiment, a device comprising multiple memory blocks spanning a plurality of power domains includes a Shared Fuse Wrapper architecture for storing the repair data of the memory blocks on a centralized fuse macro cell operatively coupled therewith, at least one repair data register for storing memory repair data thereon, each of which is operatively coupled with corresponding memory block and for transmitting the memory repair data thereto to effect repairs thereof, and a plurality of parallel links connecting the memory blocks of each power domains to the Shared Fuse Wrapper architecture.

A method of the present invention for memory repair across multiple power domains includes determining defective memory locations and corresponding repair data for each memory block in each power domain, encoding the address and the repair data of each defective memory location, storing the encoded address and repair data obtained by incremental encoding across power domains, decoding the encoded the address and the repair data during functional operation, and repairing the defective memory locations.

BRIEF DESCRIPTION OF THE DRAWINGS

The present disclosure explains the various embodiments of the instant disclosure in the following description, taken in conjunction with the accompanying drawings, wherein.

While the disclosure will be described in conjunction with the illustrated embodiment, it will be understood that it is not intended to limit the disclosure to such embodiment. On the contrary, it is intended to cover all alternatives, modifications and equivalents as may be included within the spirit and scope of the disclosure as defined by the appended claims.

DETAILED DESCRIPTION OF PREFERRED EMBODIMENTS

The embodiments of the present disclosure will now be described in detail with reference to the accompanying drawings. However, the present disclosure is not limited to the embodiments. The present disclosure can be modified in various forms. Thus, the embodiments of the present disclosure are only provided to explain more clearly the present disclosure to the ordinarily skilled in the art of the present disclosure. In the accompanying drawings, like reference numerals are used to indicate like components.

The present disclosure describes a system comprising multiple memory blocks spanning a plurality of power domains, said system comprising: a Shared Fuse Wrapper architecture for storing the repair data of the memory blocks on a centralized fuse macro cell operatively coupled therewith; at least one repair data register for storing memory repair data thereon, each of which is operatively coupled with corresponding memory block and for transmitting the memory repair data thereto to effect repairs thereof; and a plurality of parallel links connecting the memory blocks of each power domains to the Shared Fuse Wrapper architecture.

An embodiment of the present disclosure describes multiple memory architecture comprising multiple memory blocks spanning a plurality of power domains, said architecture comprising: a Shared Fuse Wrapper architecture for storing the repair data of the memory blocks on a centralized fuse macro cell operatively coupled therewith; at least one repair data register for storing memory repair data thereon, each of which is operatively coupled with corresponding memory block and for transmitting the memory repair data thereto to effect repairs thereof; and a plurality of parallel links connecting the memory blocks of each power domains to the Shared Fuse Wrapper architecture.

An embodiment of the present disclosure describes a device comprising multiple memory blocks spanning a plurality of power domains, said device comprising: a Shared Fuse Wrapper architecture for storing the repair data of the memory blocks on a centralized fuse macro cell operatively coupled therewith; at least one repair data register for storing memory repair data thereon, each of which is operatively coupled with corresponding memory block and for transmitting the memory repair data thereto to effect repairs thereof; and a plurality of parallel links connecting the memory blocks of each power domains to the Shared Fuse Wrapper architecture.

An embodiment of the present disclosure illustrates a method for memory repair across multiple power domains, said method comprising: determining defective memory locations and corresponding repair data for each memory block in each power domain; encoding the address and the repair data of each defective memory location; storing the encoded address and repair data obtained by incremental encoding across power domains; decoding the encoded the address and the repair data during functional operation; and repairing the defective memory locations.

In the present disclosure, there are two exemplary embodiments described in the disclosure to perform memory repair through common shared fuse wrapper architecture across multiple power domains on an integrated circuit. Those having ordinary skill in this art will appreciate that the configuration of the architecture has comparable distinguishing features.

Figure 1:
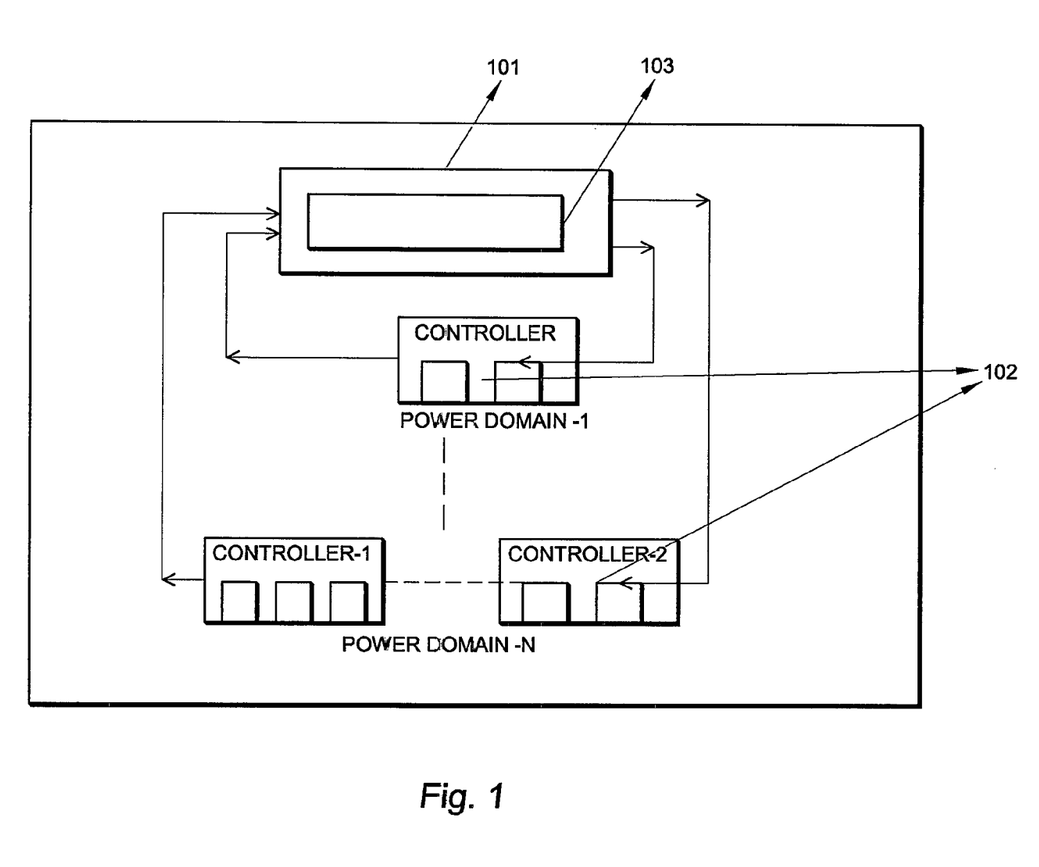
FIG. 1 illustrates an arrangement of memory repair system on an integrated circuit according to first embodiment of the present disclosure.

FIG. 1 illustrates an arrangement of a memory repair system on an integrated circuit incorporating multiple power domains according to first embodiment of the present disclosure. The memory repair system includes a common shared fuse wrapper architecture 101 to which the memory blocks in the individual power domains 102 are connected in parallel. The common shared fuse wrapper architecture 101 further includes a Fuse Macro cell 103 to store information related to different power domains. Each power domain includes multiple memory blocks coupled with BIST controllers.

Figure 2:
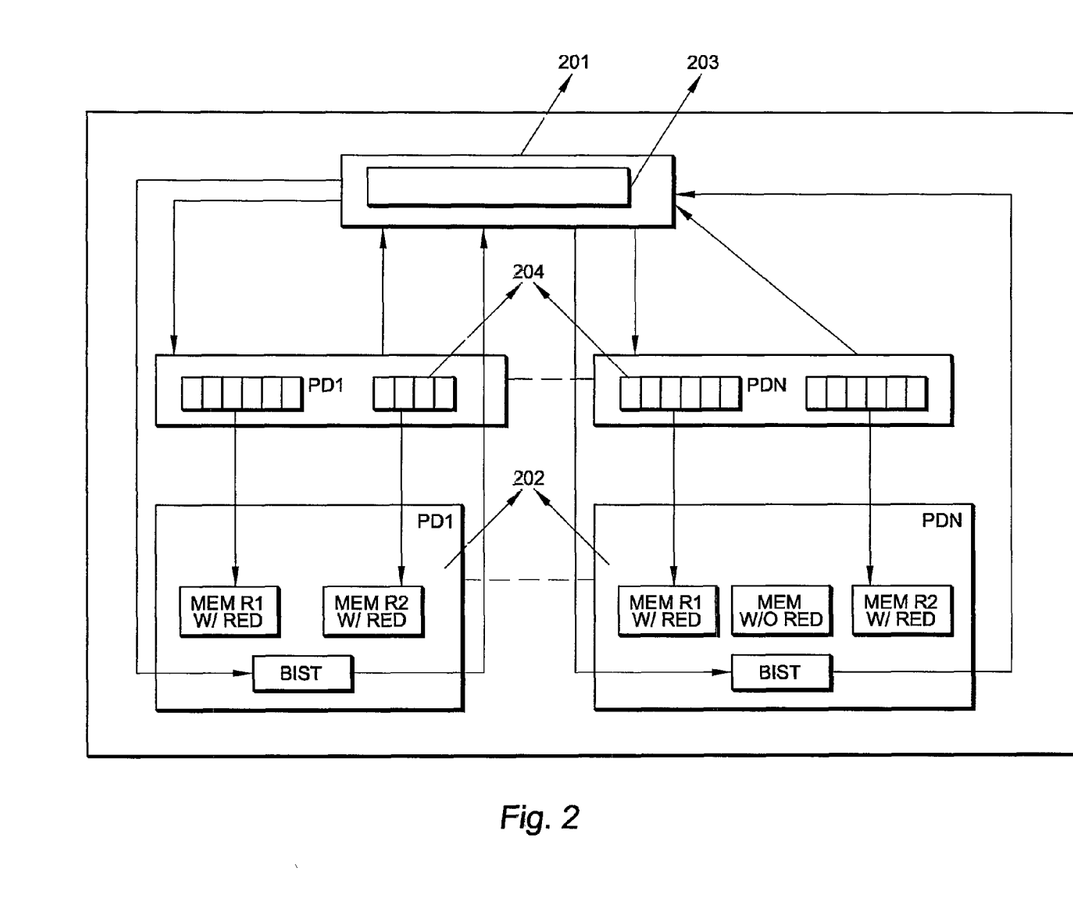
FIG. 2 illustrates an arrangement of memory repair system on an integrated circuit according to second embodiment of the present disclosure.

FIG. 2 illustrates another arrangement of a memory repair system on an integrated circuit according to second embodiment of the present disclosure. The memory repair system includes a common shared fuse wrapper architecture 201 to which the memory blocks in the individual power domains 202 are connected in parallel. The common shared fuse wrapper architecture 201 further includes a Fuse Macro cell 203 to store information related to different power domains on an integrated circuit. Each power domain consists of memories coupled with BIST controllers. And at least one external repair register 204 for storing memory repair data thereon, each of which is operatively coupled with corresponding memory and for transmitting the memory repair data thereto to effect repairs thereof.

Figure 3:
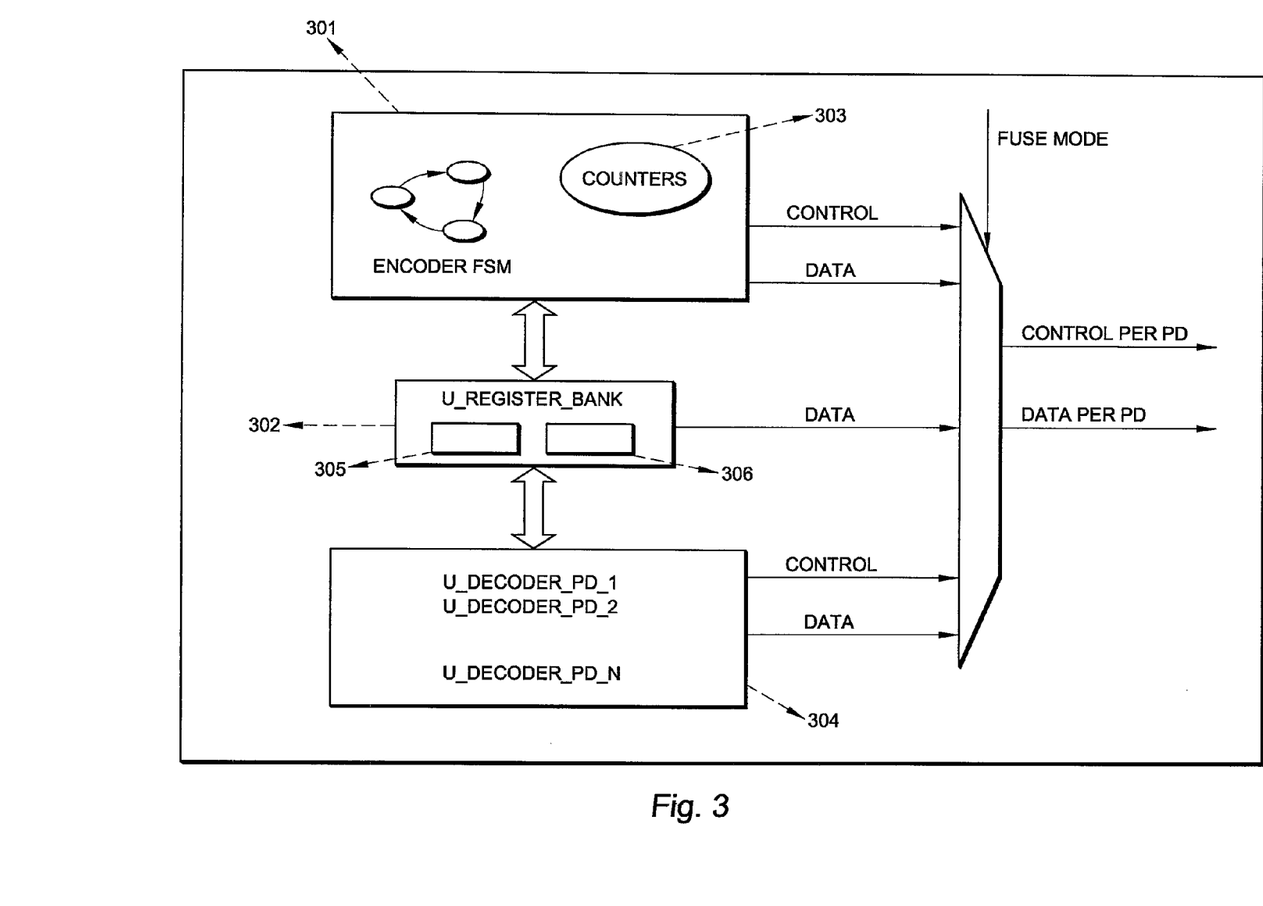
FIG. 3 illustrates internal structure of a fuse wrapper according to an embodiment of the present disclosure.

FIG. 3 illustrates internal structure of a fuse wrapper according to an embodiment of the present disclosure. The fuse wrapper includes an encoder module 301 used to encode the defective row/column data and the corresponding repair parameters for all the power domains at the end of the test process; a register data bank 302 to store the encoded defective addresses across power domains; counters 303 to keep track of the fuse bits used and remaining. The fuse wrapper also includes a decoder module 304 for decoding the encoded data during normal operation. Individual decoders Finite State Machines (FSMs) are provided for each power domain to provide for fast wake up.

Further, register data bank 302 includes shared fuse data registers 305 and a common address register bank 306. The shared fuse data registers 305 stores the complete encoded data stream during the encoding. The common address register bank 306 stores the addresses of each defective memory and its Power Domain Identity (ID). The Power Domain ID's are needed to eventually store the information in the Fuse Macro cell in ascending order of IDs. Further, maintaining the common address bank in the register bank also helps in pooling of resources and thereby reducing the overall area of the chip. There are also some additional repair data registers which store the data temporarily during encoding. The size of these repair data registers is optimized after considering all combinations of minimum number of memories to be repaired on the chip.

Figure 4:
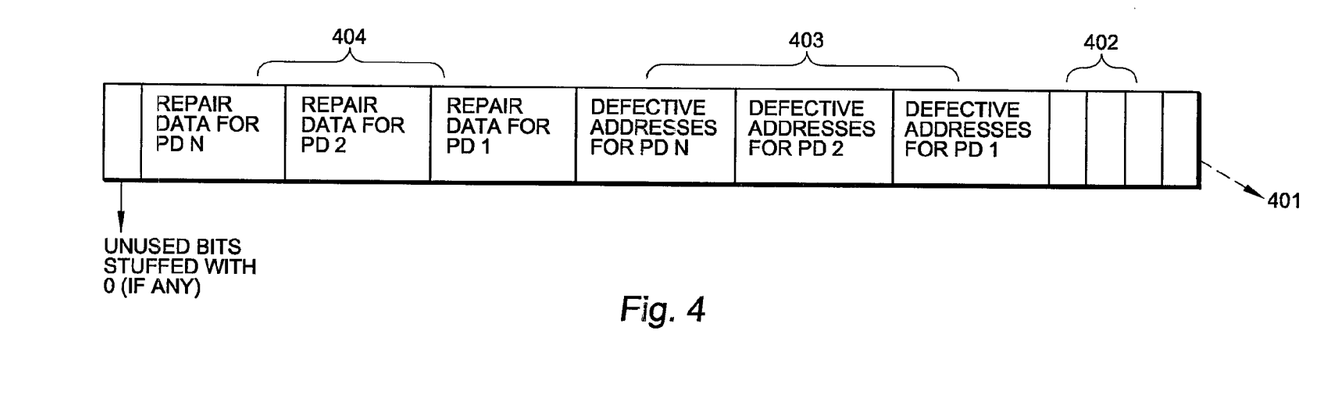
FIG. 4 illustrates frame structure of the encoded stream according to an embodiment of the present disclosure as described in FIG. 1.

FIG. 4 illustrates frame structure containing the fuse bits of the encoded stream according to an embodiment of the present disclosure described in FIG. 1. This frame structure shows the final alignment of the encoded data before shifting to tester. This frame structure comprises header 401, number of defective memories 402, defective memory addresses 403 and total repair data 404. The total number of fuse bits for the frame is computed as follows:

$$\text{Fuse Bits} = 1 + \sum_{R=1}^{R=N} (\log_2(Mr+1)) + \sum_{R=1}^{R=N} (Krd \text{ Length}) + Kmin * \text{Log}_2(Bf) + Krd(\text{max})$$

where 'N' is the number of Power Domains; 'Mr' is the number of redundant memories in a Power Domain; Krd (length) is the length of total repair data (corresponding to Kmin memories) in a Power Domain; 'Kmin' is the minimum number of memories that can be repaired on a chip; $\text{Log}_2(Bf)$ is the logarithm to base 2 of the maximum number of memories on the Power Domain; and 'Krd(max)' is the largest repair data length corresponding to Kmin memories across Power Domains.

Further, header 401 contains a single global repair bit. When the global bit is at logic 0 it indicates there are no bad memories on the chip to be repaired. When the global bit is at logic 1, it indicates that a repair is needed for the bad memories on the chip.

Furthermore, the numbers of defective memories 402 are approximated by the following:

$$\sum_{R=1}^{R=N} (\log_2(Mr+1))$$

and the value of all defective memory addresses 403 are computed using $Kmin*\text{Log}_2(Bf)$. (While the bits always need to be repaired are Kmin; these Kmin memories can fail in a single power domain or across more than one power domains.) Therefore, the repair capability of Fuse Wrapper varies from 1 to Kmax memories (Kmax memories are defined as the capability to repair more number of memories by fuse wrapper shared architecture. It is possible when more number of memories can fail in a power domain but with lesser repair data length.). The memories up to Kmin will always be repaired while memories within Kmin<K<=Kmax may or may not be repaired. It will be appreciated by those having ordinary skill in this art that the other frame structures may have comparable arrangements.

Figure 5:
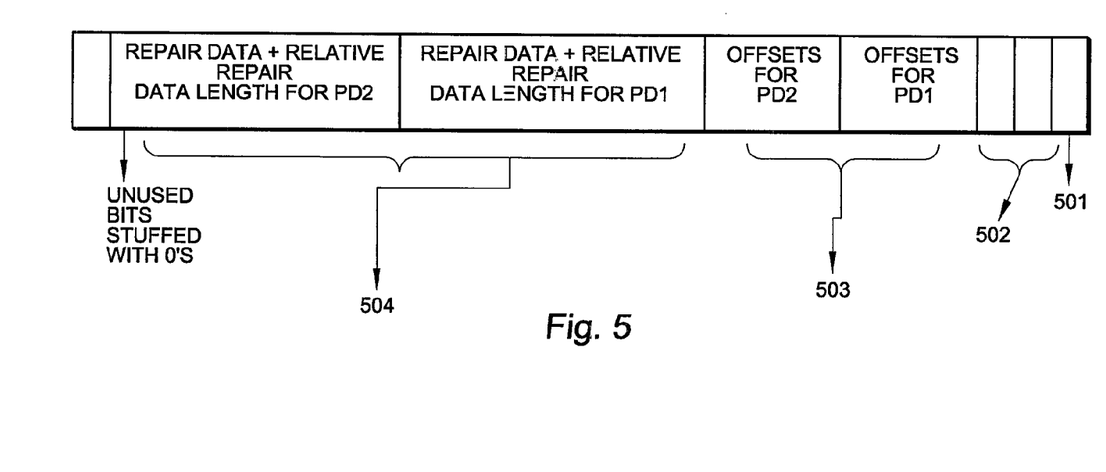
FIG. 5 illustrates frame structure of the encoded stream according to another embodiment of the present disclosure as described in FIG. 2.

FIG. 5 illustrates frame structure containing the fuse bits of the encoded stream according to the embodiment of the present disclosure described in FIG. 2. This frame structure shows the final alignment of the encoded data before shifting to tester. This frame structure comprises header 501, number of defective memories 502, offset corresponding to each power domain 503 and total repair data 504. The total number of fuse bits needed to repair Kmin memories can be computed as follows:

$$\text{Fuse bits} = (\text{Header}) + \sum_{i=1}^{i=N} [\log 2(Mi(r)+1)] + \log 2(\textit{Offseti}) * Kmin + Krd - reli(\text{Max}) * Kmin + Krd \text{ max}$$

where, 'i'=1 to N denotes the total no. of power domains; '{log 2 (Offseti)*Kmin+Krd–reli (Max)*Kmin+Krd max}' corresponds to the power domain that has the largest value of the sum; 'Offseti' corresponds to the total repair data corresponding to all the repair memories in a power domain and Krd-rel corresponds to the maximum relative repair data length within a power domain. It will be appreciated by those having ordinary skill in this art that the other frame structures may have comparable arrangements.

Figure 6:
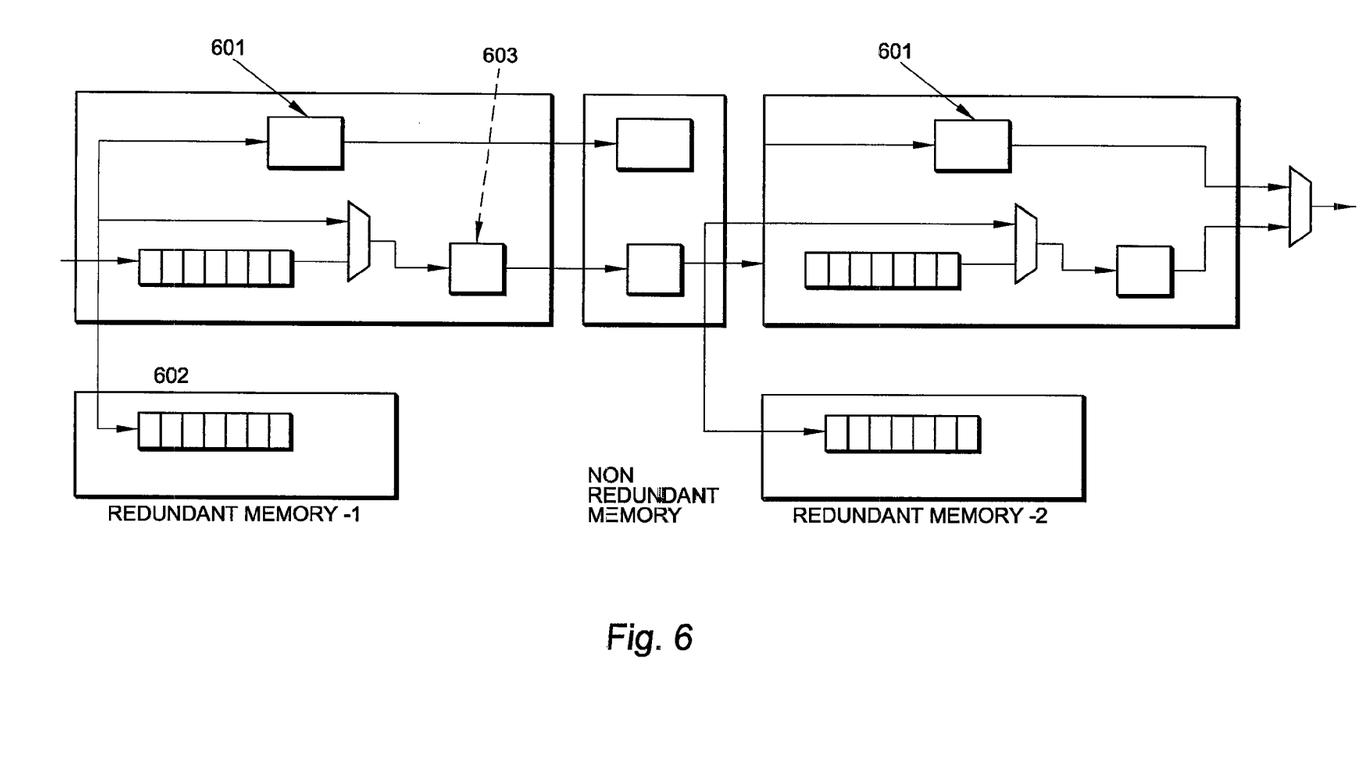
FIG. 6 illustrates architecture of the serial interface in accordance with the present disclosure.

FIG. 6 illustrates interconnections between BIST associated with a memory having a serial repair interface in accordance with the present disclosure. Those having ordinary skill in the art will appreciate that the configuration of other built-in-self-repairs may have comparable configurations. In this serial interface, there is one serial chain across repair status register 601; another serial chain passes through the repair data registers 602 of BIST and also of memory. The repair data register contains bypass flop 603 and other flip-flops. In case of non redundant memory, the repair data register will be of single bit. In a functional operation, the repair data register (except for bypass flop) will be bypassed if the memory is good.

Figure 7:
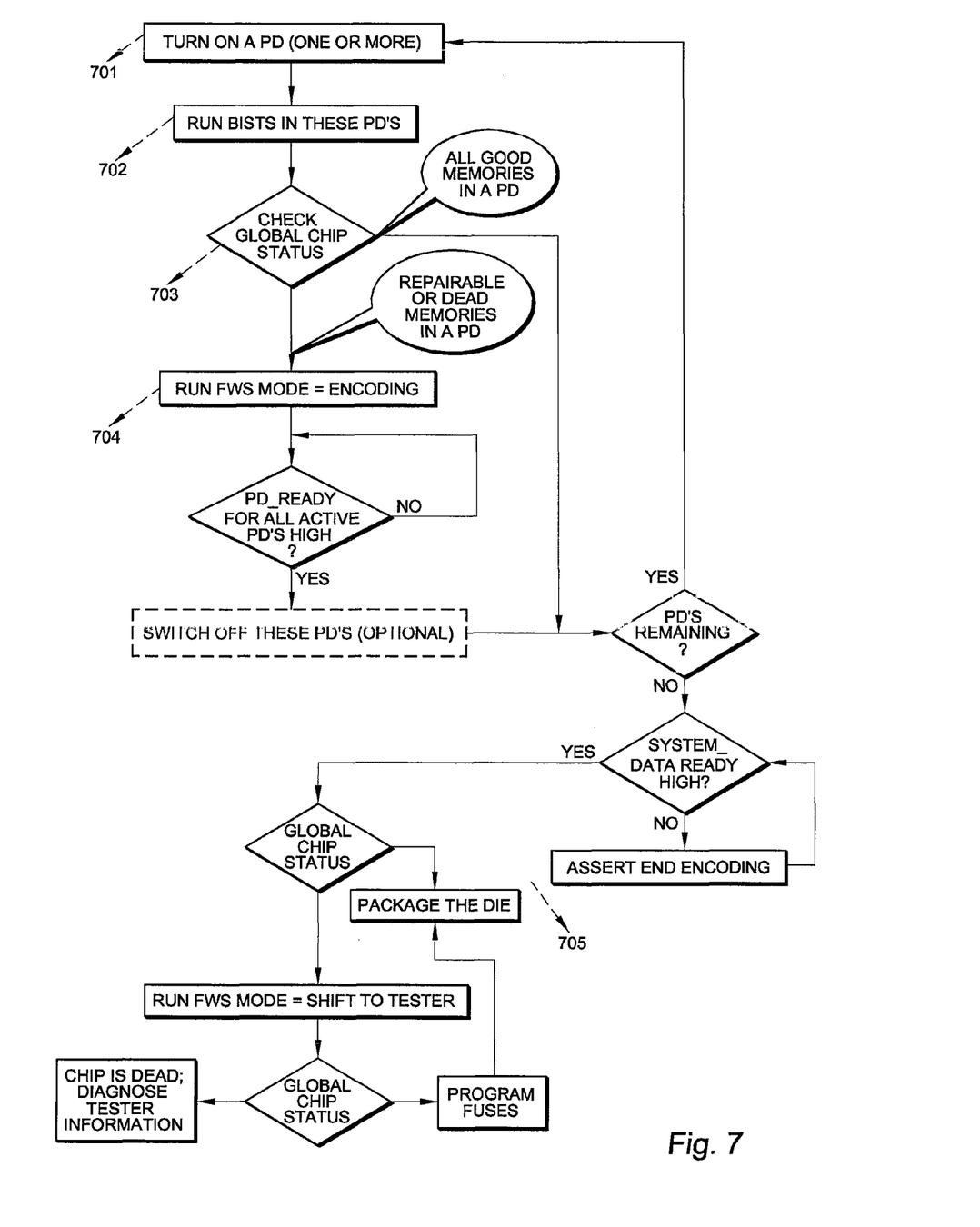
FIG. 7 illustrates a flow chart for a method for memory testing according to an embodiment of the present disclosure.
Figure 8:
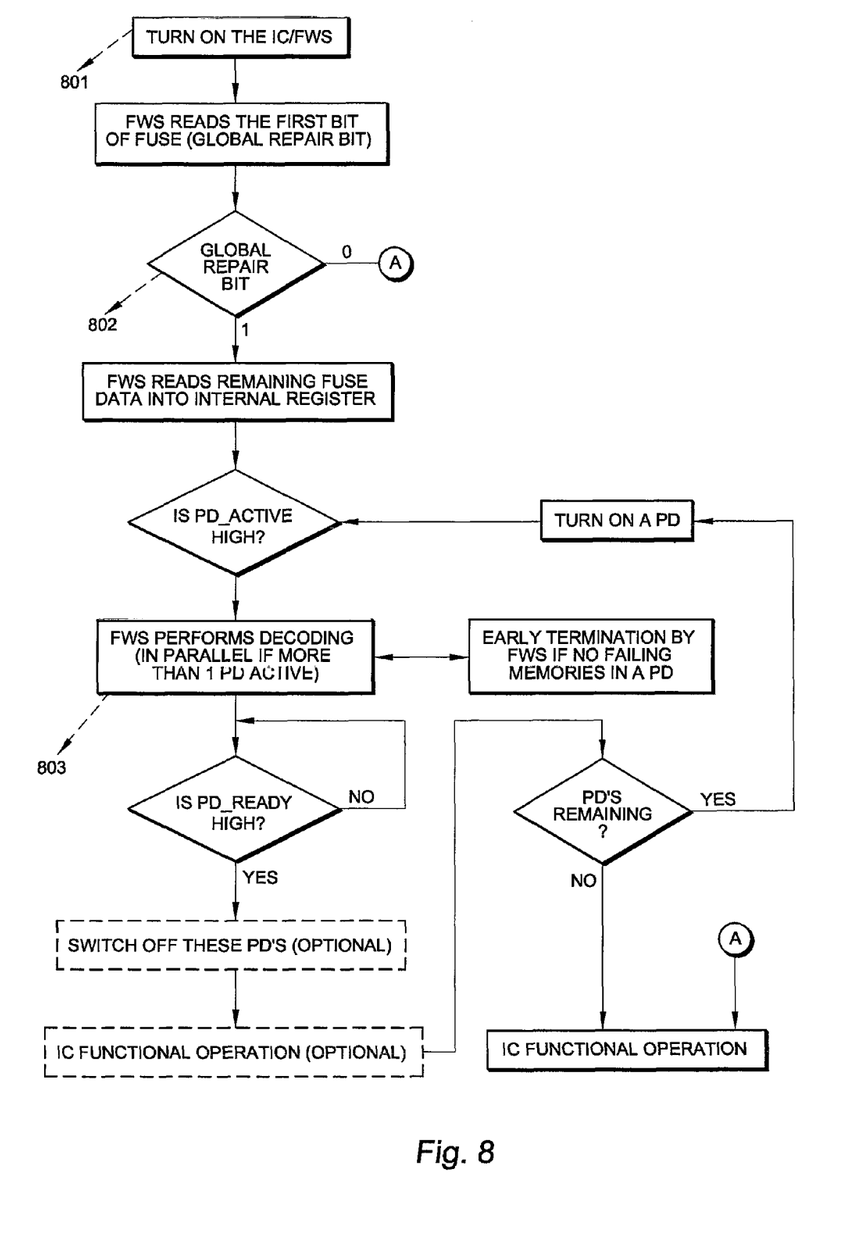
FIG. 8 illustrates a flow chart for a method for memory repair according to an embodiment of the present disclosure.

Embodiments of the method for memory test and repair routing are described in FIG. 7 and FIG. 8. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 7 illustrates a flow chart for a method for memory testing according to an embodiment of the present disclosure. In step 701, the testing starts with switching on the power domain and asserting a handshake signal pd_active. In step 702, BIST is run to analyze all the memories in that power domain and determines the defective addresses and corresponding repair data. Once the BIST has completed the process, in step 703 the global status signal is checked. If all the memories are good then the global chip status (the global status is a two bit status output generated from the fuse wrapper) is "01" and the encoding process is skipped to save time and testing proceeds to other power domains. If any of the memories is dead then the global chip status is "10" and encoding is again terminated early as dead memories cannot be repaired. If the memories are repairable in a power domain then the global chip status is "11" and the encoding mode is asserted by the fuse wrapper.

Further, in step 704 Fuse Wrapper is run in an encoding mode. The encoding is done sequentially even if more than one Power Domain is switched on simultaneously. If all the memories are good, encoding is terminated earlier than usual to save test time. Otherwise, in case of repairable memories, finite state machine (FSM) of encoder calculates the logical addresses of defective memories and stores them in shared fuse data registers. The memory repair data for defective memories is then shifted from BIST to Fuse Wrapper serially.

After completion of the complete process for a single power domain, Fuse wrapper provides a handshake signal called pd_ready to indicate the end of encoding for this Power Domain. Similarly, the encoding for the other Power Domains is performed in the aforementioned manner. When encoding for all Power Domains has been completed a handshake signal called system_dataready is asserted showing end of encoding, the encoded data per Power Domain is realigned and arranged in ascending order of Power Domain's as shown in FIG. 4. This arrangement obviates the need to store power domain ID on fuse macro cell and thereby saves area. This encoded stream is transferred to an external tester and fuses are programmed with this encoded stream for chip repair. Finally, in step 705 after the completion of the complete encoding process, the integrated circuits are packaged with the encoded information for shipment.

Referring to FIG. 7 the encoding process of addresses and repair data for both the embodiments is explained in the subsequent lines separately. It will be apparent to those having ordinary skill in this art that various modifications and variations may be made to the encoding process disclosed herein, consistent with the present invention, without departing from the spirit and scope of the present invention. According to the first exemplary embodiment the encoding of addresses and repair data follows two cycles:

(a) In the first cycle, finding out the number of defective memories, total repair data length and their logical addresses by transferring 0/1 mode and repair status in BIST, which loads serial registers for redundant memories with 11 . . . 11110, while for non redundant memory '0' is loaded. If the status is good only 1 flop will come in the chain. Further, the transferred data is shifted out from BIST to shard Fuse Wrapper and the following pattern in the repair status of each memory based on its header content as follows:
  10: start encoding redundant memory; increment defective memory count; store the logical address of defective memory and start counting the repair data length in counter.
  11: increment the repair data length counter.
  01: end encoding of redundant memory and store the value of repair data length counter.
  00: ignore it as it corresponds to data of non redundant memory.
  If the fuse bits are insufficient and the global chip status (the global status is a two bit status output generated from the fuse wrapper) is "00", then skip up the encoding process.

(b) In the second cycle, transferring the actual repair data in BIST and shift out the data from BIST to Fuse Wrapper. Whenever a 1 is obtained, it is a start of redundant memory. Load repair data length stored in first cycle. These cycles are repeated until all defective memories are encoded completely.

Further, according to the second exemplary embodiment the encoding of the defective memory addresses and repair data also follows two cycles:

(a) The first cycle finds out the number of defective memories, total repair data length and their logical addresses by transferring 0/1 mode and repair status in BIST, where serial registers for good Redundant memories are loaded with 0111 . . . 1 and for repairable memories loaded with 011 . . . 01 (Ending in 01), while for non redundant memory it is loaded with '0'. Furthermore, the above said data are shifted out of the Serial interface as shown in FIG. 5, and performs a pattern search for all memories: if a 0 is obtained, then ignore it as it is a bypass flop; if a 1 is followed by 0, it is a good redundant memory and add to the offset length till a next 0 is obtained which signifies the end of this memory. Reset the pattern. If a 1 is followed by 1, it is a defective redundant memory, add to defective memory count. Furthermore, add to failing memory data length till a next '0' is obtained which signifies the end of this memory. Save the current offset value also and reset the pattern. Repeat all the steps for all the bits on a power domain.
  If the fuse bits are insufficient and the global chip status (the global status is a two bit status output generated from the fuse wrapper) is "00", then skip up the encoding process.

(b) In the second cycle, transfer actual repair data and repair status in Serial Interface and shift repair data from Serial Interface to Fuse Wrapper. Whenever a 1 is obtained, shift for cycles equal to the length stored in the first cycle. Save this repair data and continue and repeat till a next 1 is obtained. Early terminate when number of defective memories is equal to the defective memory count.

FIG. 8 illustrates a flow chart for a method for memory repair according to an embodiment of the present disclosure. During chip in-field operation, step 801 starts the process by turning Fuse wrapper on. In step 802, the global repair bit is checked, if the repair bit is 0 (represents a good chip) then decoding is instantly terminated for fast chip wake up. If the global repair bit is 1, pd_active signal is asserted, and decoding process is started. In step 803, Fuse Wrapper downloads the encoded stream and stores the defective memory count of each Power Domains IDs in the internal registers. This defective memory count is then used to identify the addresses of each Power Domain ID. If there is an address match, the index pointer is shifted to point to the next address in the address register bank with the corresponding Power Domain ID. Similarly, the entire data is shifted out and the end signal pd_ready is asserted showing completion of the decoding. If two or more Power Domains are turned on simultaneously, multiple decoder finite state machines (FSMs) are run in tandem transferring the repair data in all chains independent of each other and enabling fast memory repair by significantly reducing the wake up time.

Similarly, referring to FIG. 8 the decoding process of addresses and repair data for both the embodiments is explained in the subsequent lines separately. It will be apparent to those having ordinary skill in this art that various modifications and variations may be made to the encoding process disclosed herein, consistent with the present invention, without departing from the spirit and scope of the present invention. According to the first exemplary embodiment, the decoding follows the following steps:

The Following Initialization Step is Performed as Soon as the Integrated Circuit is Turned On:

Shift the encoded data from Fuse Macro Cell to the shared Fuse Wrapper registers and segregate the number of failing memories, their logical addresses and the repair data and store them in shared Fuse Wrapper registers. (This step is performed irrespective of power domain's getting turned as to enable fast operation.)

The Following Steps are Done to Send the Repair Data to Memory, when a Power Domain is Turned On:

Shift 11 in repair status registers of BIST Serial Interface so that all the repair registers of BIST are connected. Load 0/1 pattern mode in BIST Serial Interface repair registers and shift out the 0/1 pattern from BIST Serial Interface to shared Fuse Wrapper. If the shifted address matches with the failing memory address as stored in shared Fuse Wrapper, shift out that memory's repair data into Memory; if the address does not match, shift 0's into Memory (this corresponds to good memory). At the end of all shifts the correct data will be initialized in all the memories of a Power domain. If a Power Domain is turned off and on again, the above steps will be performed again to reinitialize the memory. If two or more power domains are turned on simultaneously, the repair of memories in both power domains will happen in parallel implying fast wake up.

Further, according to the second exemplary embodiment, the decoding follows the following steps, The Following Initialization Step is Performed as Soon as the Integrated Circuit is Turned On and the Following Steps are Performed Irrespective of Power Domain's Switching on to Enable Fast Operation:

Shift the encoded addresses and repair data from Fuse Macro cell to shared Fuse Wrapper registers and segregate the number of defective memories, their logical addresses and the repair data and store these in shared Fuse Wrapper registers.

Load first offset value.

Shift 0's into the local repair data registers till the Offset count is 0.

Now load the length of the first repair data

Shift the repair data into the Local registers till the length of the first repair data.

The above mentioned steps are repeated for all the repair data for a particular Power Domain/Repair Chain. This is done till all the repair data registers for all the Power Domains are configured. The data is held inside the local registers which are in always on domain and this further avoids again turning on and off the power domains and performing the initialization process again and again. Thus, there is overall improvement in the processing time of the repair mechanism in subsequent wake ups.

The present disclosure proposed by shared Fuse Wrapper Architecture saves chip area by optimally sharing resources across all power domains and provides for fast wake up. According to the first embodiment, in the described architecture, the fast wake up time reduces the memory repair time of various Power Domains by removing the dependency by accessing the repair information for a particular Power Domain independent of the order in which it was stored on the Fuse Macro cell i.e. one or more Power Domains can be switched on independent of the other.

The present disclosure is applicable to all types of on-chip and off chip memories used in various in digital electronic circuitry, or in hardware, firmware, or in computer hardware, firmware, software, or in combination thereof. Apparatus of the invention can be implemented in a computer program product tangibly embodied in a machine-readable storage device for execution by a programmable processor; and methods actions can be performed by a programmable processor executing a program of instructions to perform functions of the invention by operating on input data and generating output. The invention can be implemented advantageously on a programmable system including at least one input device, and at least one output device. Each computer program can be implemented in a high-level procedural or object-oriented programming language or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; CD-ROM and DVD-ROM disks; and buffer circuits such as latches and/or flip flops. Any of the foregoing can be supplemented by, or incorporated in ASICs (application-specific integrated circuits), FPGAs (field-programmable gate arrays) and/or DSPs) digital signal processors).

It will be apparent to those having ordinary skill in this art that various modifications and variations may be made to the embodiments disclosed herein, consistent with the present invention, without departing from the spirit and scope of the present invention. Other embodiments consistent with the present invention will become apparent from consideration of the specification and the practice of the invention disclosed herein.

Although the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

We claim:

1. A system comprising multiple memory blocks spanning a plurality of power domains, said system comprising:
    a Shared Fuse Wrapper architecture for storing the repair data of the memory blocks on a centralized fuse macro cell operatively coupled therewith;
    at least one repair data register operatively coupled with a corresponding memory block, for storing memory repair data thereon and for transmitting the memory repair data thereto to effect repairs of the corresponding memory block; and
    a plurality of parallel links connecting the memory blocks of the plurality of power domains to the Shared Fuse Wrapper architecture,
    wherein the capacity of said fuse macro cell is given by a function of a number of redundancy memories in a power domain, a length of total repair data in a power domain, a minimum number of memories to be repaired, a number of bypass flops corresponding to logical addresses, and a largest repair data length corresponding to the minimum number of memories to be repaired across power domains.

2. The system as claimed in claim 1, wherein said memory blocks are coupled with fuse macro cell through the Shared Fuse Wrapper architecture.

3. The system as claimed in claim 2, wherein the shared fuse wrapper architecture comprises:
    an encoder module for encoding the defective memory locations and the repair data of each defective memory;
    a decoder module for decoding the encoded defective memory location in fuse data registers and transferring the corresponding repair data in repair data registers; and
    said fuse registers operatively coupled to the output of said encoder module and input of said decoder module.

4. The system as claimed in claim 1, wherein the said repair data register is located outside its associated power domain used by the Shared Fuse Wrapper architecture.

5. The system as claimed in claim 1, wherein said memory block is a SRAM or a DRAM or a ROM memory block.

6. A multiple memory architecture comprising multiple memory blocks spanning a plurality of power domains, said system comprising:
- a Shared Fuse Wrapper architecture for storing the repair data of the memory blocks on a centralized fuse macro cell operatively coupled therewith;
- at least one repair data register for storing memory repair data thereon, each of which is operatively coupled with corresponding memory block and for transmitting the memory repair data thereto to effect repairs thereof; and
- a plurality of parallel links connecting the memory blocks of each power domain to the Shared Fuse Wrapper architecture,
- wherein the capacity of said fuse macro cell is given by a function of a number of redundancy memories in a power domain, a length of total repair data in a power domain, a minimum number of memories to be repaired, a number of bypass flops corresponding to logical addresses, and a largest repair data length corresponding to the minimum number of memories to be repaired across power domains.

7. The architecture as claimed in claim 6, wherein said memory blocks are coupled with fuse macro cell through the Shared Fuse Wrapper architecture.

8. The architecture as claimed in claim 7, wherein the shared fuse wrapper architecture comprises:
- an encoder module for encoding the defective memory locations and the repair data of each defective memory;
- a decoder module for decoding the encoded defective memory location in fuse data registers and transferring the corresponding repair data in repair data registers; and
- said fuse registers operatively coupled to the output of said encoder module and input of said decoder module.

9. The architecture as claimed in claim 6, wherein the said repair data register is located outside its associated power domain used by the Shared Fuse Wrapper architecture.

10. The architecture as claimed in claim 6, wherein said memory block is a SRAM or a DRAM or a ROM memory block.

11. A device comprising multiple memory blocks spanning a plurality of power domains, said system comprising:
- a Shared Fuse Wrapper architecture for storing the repair data of the memory blocks on a centralized fuse macro cell operatively coupled therewith;
- at least one repair data register for storing memory repair data thereon, each of which is operatively coupled with corresponding memory block and for transmitting the memory repair data thereto to effect repairs thereof; and
- a plurality of parallel links connecting the memory blocks of each power domains to the Shared Fuse Wrapper architecture,
- wherein the capacity of said fuse macro cell is given by a function of a number of redundancy memories in a power domain, a length of total repair data in a power domain, a minimum number of memories to be repaired, a number of bypass flops corresponding to logical addresses, and a largest repair data length corresponding to the minimum number of memories to be repaired across power domains.

12. The device as claimed in claim 11, wherein said memory blocks are coupled with fuse macro cell through the Shared Fuse Wrapper architecture.

13. The device as claimed in claim 12, wherein the shared fuse wrapper architecture comprises:
- an encoder module for encoding the defective memory locations and the repair data of each defective memory;
- a decoder module for decoding the encoded defective memory location in fuse data registers and transferring the corresponding repair data in repair data registers; and
- said fuse registers operatively coupled to the output of said encoder module and input of said decoder module.

14. The device as claimed in claim 11, wherein the said repair data register is located outside its associated power domain used by the Shared Fuse Wrapper architecture.

15. The device as claimed in claim 11, wherein said memory block is a SRAM or a DRAM or a ROM memory block.

* * * * *